United States Patent [19]
Ho et al.

[11] Patent Number: 6,055,183
[45] Date of Patent: Apr. 25, 2000

[54] ERASE METHOD OF FLASH EEPROM BY USING SNAPBACK CHARACTERISTIC

[75] Inventors: Ming-Chou Ho, Taichang; Jian-Hsing Lee, Hsin-chu; Kuo-Reay Peng, TarnySan; Juang-Ke Yeh, Hsin-Chu, all of Taiwan

[73] Assignee: Taiwan Semiconductor Manufacturing Company, Ltd., Hsin-Chu, Taiwan

[21] Appl. No.: 08/957,678

[22] Filed: Oct. 24, 1997

[51] Int. Cl.[7] ....................................... G11C 16/04
[52] U.S. Cl. ................. 365/185.09; 365/185.29; 365/185.27; 365/185.33
[58] Field of Search .......................... 365/185.29, 185.33, 365/185.27, 185.09

[56] References Cited

U.S. PATENT DOCUMENTS 5,726,933  3/1998  Lee et al. ............................ 365/185.18
5,828,605  10/1998  Peng et al. ......................... 365/185.29

*Primary Examiner*—Andrew Q. Tran
*Attorney, Agent, or Firm*—George O. Saile; Stephen B. Ackerman; Billy J. Knowles

[57] ABSTRACT

A method to erase data from a flash EEPROM while electrical charges trapped in the tunneling oxide of a flash EEPROM are eliminated to maintain proper separation of the programmed threshold voltage and the erased threshold voltage after extended programming and erasing cycles, while preventing damage due to high field stress in the tunneling oxide. The method to erase a flash EEPROM cell begins by applying a relatively high positive voltage pulse to the source of the EEPROM cell. Simultaneously a ground reference voltage is applied to the drain and to the semiconductor substrate. At the same time a relatively large negative voltage pulse is applied to the control gate. This will cause a parasitic bipolar transistor to conduct and go into a snap back condition reducing the voltage field in the tunneling oxide.

16 Claims, 6 Drawing Sheets

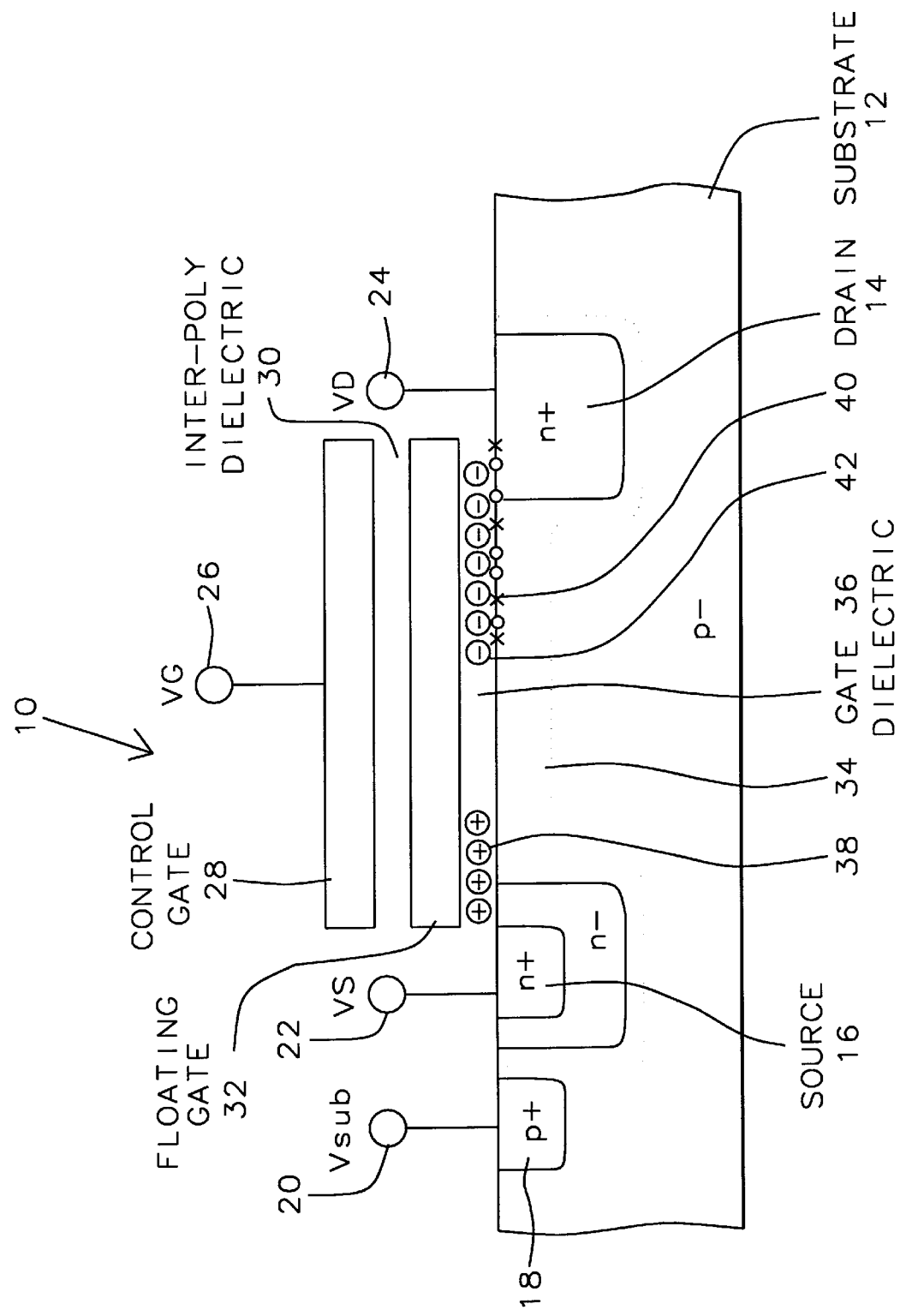
FIG. 1 – Prior Art

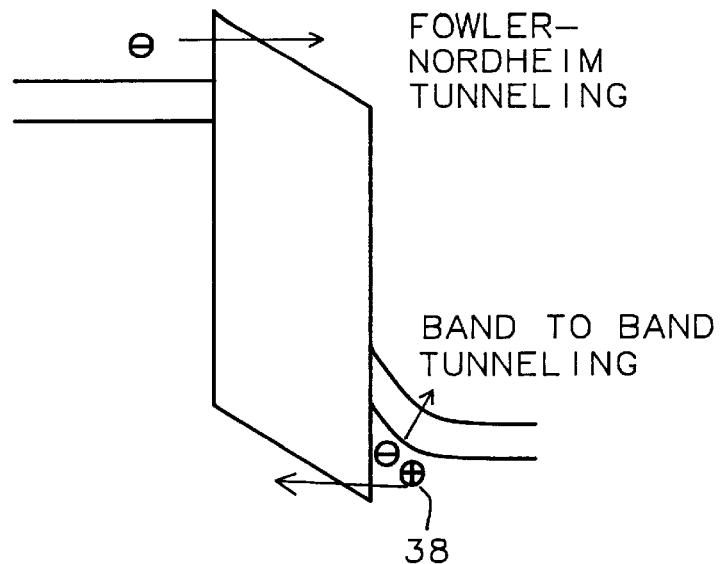
FIG. 2 - Prior Art
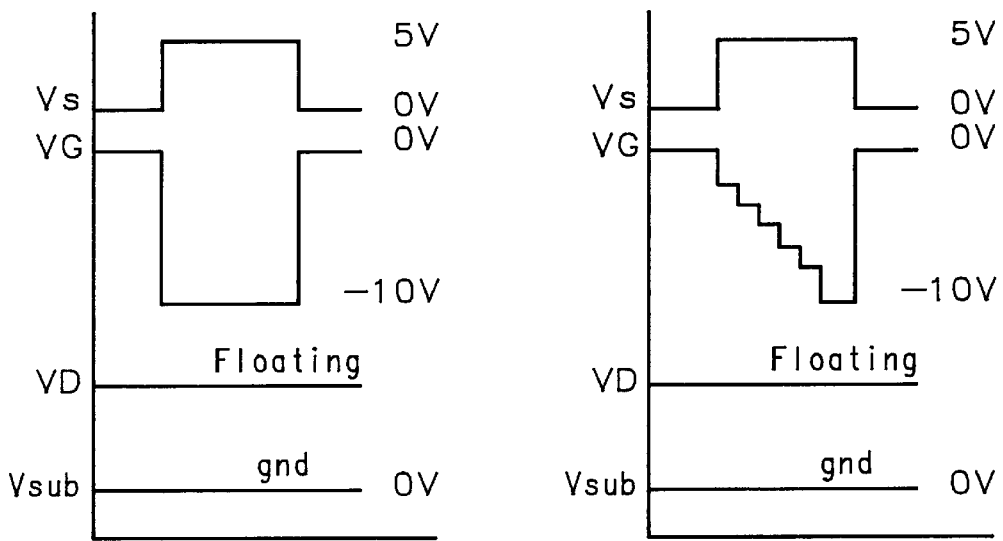
FIG. 3a - Prior Art
FIG. 3b - Prior Art

ERASE METHOD OF FLASH EEPROM BY USING SNAPBACK CHARACTERISTIC

RELATED PATENT APPLICATIONS

U.S. patent application Ser. No.: 08/928,217, Filing Date: Sep. 12, 1997, "A Novel Method To Improve Flash EEPROM Write/Erase Threshold Closure," now allowed, assigned to the Same Assignee as the present invention.

U.S. Pat. No. 5,903,499, issued May 11, 1999 from U.S. patent application Ser. No.: 08/928,227 Filing Date: Sep. 12, 1997, "A Novel Method to Erase A Flash EEPROM Using Negative Gate Source Erase Followed By A High Negative Gate Erase," assigned to the Same Assignee as the present invention.

U.S. Pat. No. 5,862,078 issued Jan. 19, 1999 from U.S. patent application Ser. No.: 08/907,984, Filing Date: Aug. 11, 1997, "A Mixed Mode Erase Method To Improve Flash EEPROM Write/Erase Threshold Closure," assigned to the Same Assignee as the present invention.

U.S. Pat. No. 5,838,618 issued Nov. 17, 1998 from U.S. patent application Ser. No.: 08/927,472, Filing Date: Sep. 11, 1997, "A Bi-Modal Erase Method For Eliminating Cycling-induced Flash EEPROM Cell Write/Erase Threshold Closure," assigned to the Same Assignee as the present invention.

FIELD OF THE INVENTION

This invention relates generally to a class of non-volatile memory devices referred to as flash electrically erasable programmable read-only memory (flash EEPROM). More particularly, this invention relates to methods and means to erase digital data from a flash EEPROM cell and for preventing trapped charges in the tunneling oxide of the flash EEPROM cell and reducing damage to the tunneling oxide due to high electrical field stress.

DESCRIPTION OF RELATED ART

The structure and application of the flash EEPROM is well known in the art. The Flash EEPROM provides the density advantages of an erasable programmable read-only memory (EPROM) that employs ultra-violet light to eliminate the programming with the speed of a standard EEPROM. FIG. 1 illustrates a cross-sectional view of a flash EEPROM cell of the prior art. The flash EEPROM cell 10 is formed within a p-type substrate 12. An $n^+$ drain region 14 and an $n^+$ source region 16 is formed within the p-type substrate 12.

A relatively thin gate dielectric 36 is deposited on the surface of the p-type substrate 12. The thin gate dielectric 36 will also be referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A $p^+$ diffusion 18 is placed in the p-type substrate 12 to provide a low resistance path from a terminal 20 to the p-type substrate. The terminal 20 will be attached to a substrate voltage generator Vsub. In most application of an EEPROM, the substrate voltage generator Vsub will be set to the ground reference potential (0V).

The source region 16 will be connected to a source voltage generator VS through the terminal 22. The control gate 28 will be connected through the terminal 26 to the control gate voltage generator VG. And the drain region 14 will be connected through the terminal 24 to the drain voltage generator VD.

According to conventional operation, the flash EEPROM cell 10 is programmed by setting the gate control voltage generator VG to a relatively high voltage (on the order of 10V). The drain voltage generator VD is set to a moderately high voltage (on the order of 5V), while the source voltage generator VS is set to the ground reference potential (0V).

With the voltages as described above, hot electrons will be produced in the channel 34 near the drain region 14. These hot electrons will have sufficient energy to be accelerated across the gate dielectric 36 and trapped on the floating gate 32. The trapped hot electrons 33 will cause the threshold voltage of the field effect transistor (FET) that is formed by the flash EEPROM cell 10 to be increased by three to five volts. This change in threshold voltage by the trapped hot electrons 33 causes the cell to be programmed.

During the programming process some of the hot electrons will be trapped 42 in the tunneling oxide 36 or produce some surface states 40 at the surface of the p-type substrate 12. These trapped electrons will cause the threshold voltage of the programmed flash EEPROM cell 10 to decrease.

To erase the flash EEPROM cell 10, as shown in FIG. 3a and described in U.S. Pat. No. 5,481,494 (Tang et al.), a positive voltage (on the order of 5V) is generated by the source voltage generator VS. The substrate voltage generator VS is set to the ground reference potential. The control gate voltage generator VG generates a relatively large negative voltage on the order of –10V. The drain voltage generator VD is usually disconnected from the terminal 24 to allow the drain region 14 to float. Under these conditions there is a large electric field developed across the tunneling oxide 36 in the source region 16. This field causes the electrons trapped 33 in the floating gate 32 to flow to portion of the floating gate 32 that overlaps the source region 16. The electrons are then extracted to the source region 16 by the Fowler-Nordheim tunneling, as can be seen in FIG. 2.

During the erasure process as shown in FIG. 2, some positive charges 38 will be forced and trapped in the tunneling oxide 36. These trapped positive charges 38 will cause the threshold voltage of the erased flash EEPROM cell 10 to decrease initially and then to raise as the cycling time is increased.

U.S. Pat. No. 5,485,423 (Tang et al.), as shown in FIG. 3b, describes a method of erasure of a flash EEPROM. A relatively low positive pulse voltage VS is applied to the source region of the flash EEPROM cell during the erase cycle. Simultaneously, a negative ramp voltage is applied to the control gate of the flash EEPROM. The drain region will be allowed to float, while the substrate voltage Vsub will be set to the ground reference voltage. This will achieve an averaging of the tunneling field during the entire erase cycle.

U.S. Pat. No. 5,521,866 (Akaogi) describes a non volatile semiconductor memory device having a floating gate. The memory device is constructed with two wells diffused into the semiconductor substrate. The source and drain are then diffused into the second well with a floating gate and control gate disposed on the surface of the semiconductor substrate much as described in FIG. 1. The erasure process involves applying a positive voltage to each of the two wells.

U.S. Pat. No. 5,231,602 (Radjy et al.) describes a method of erasing a flash EEPROM cell by controlling the electric field across the tunneling oxide. The drain is connected through a variable resistor to a programming voltage source and a variable voltage source is connected to the source. The variable voltage source is adjusted between 0 and 5V, while the programming voltage source is set between 5V and 20V. The tunneling current is optimized by adjustment of the variable resistor and the variable voltage.

U.S. Pat. No. 5,412,608 (Oyama) describes a method of erasing a flash EEPROM cell by applying a relatively large negative pulse to the control gate followed by a relatively large positive pulse to the control gate. The relatively large negative pulse will erase the flash EEPROM cell, while the relatively large positive pulse will equalize the threshold voltages of an array of flash EEPROM cells.

SUMMARY OF THE INVENTION

An object of this invention is to provide a method for the erasure of data from a flash EEPROM.

Another object of this invention is to provide a method to prevent trapping of electrical charges in the tunneling oxide.

Further another object of this invention is to prevent high field stress in the tunneling oxide of a flash EEPROM to prohibit damage to the tunneling oxide after extended programming and erasing cycles.

To accomplish these and other objects a method to erase a flash EEPROM cell begins by first applying a first relatively high positive voltage pulse to the source of the EEPROM cell. Simultaneously a ground reference voltage is applied to the drain and to the semiconductor substrate. At the same time a relatively large negative voltage pulse is applied to the control gate. This will cause a parasitic bipolar transistor to conduct and go into a snap back condition preventing high electric field within the tunneling oxide.

BRIEF DESCRIPTION OF THE DRAWINGS

FIG. 1 is cross-sectional view of a flash EEPROM of the prior art.

FIG. 2 is an energy band diagram showing charge of an erase cycle of the flash EEPROM of the prior art.

FIGS. 3a and 3b are timing diagrams of an erase cycle of the prior art.

DETAILED DESCRIPTION OF THE INVENTION

Figure 4:
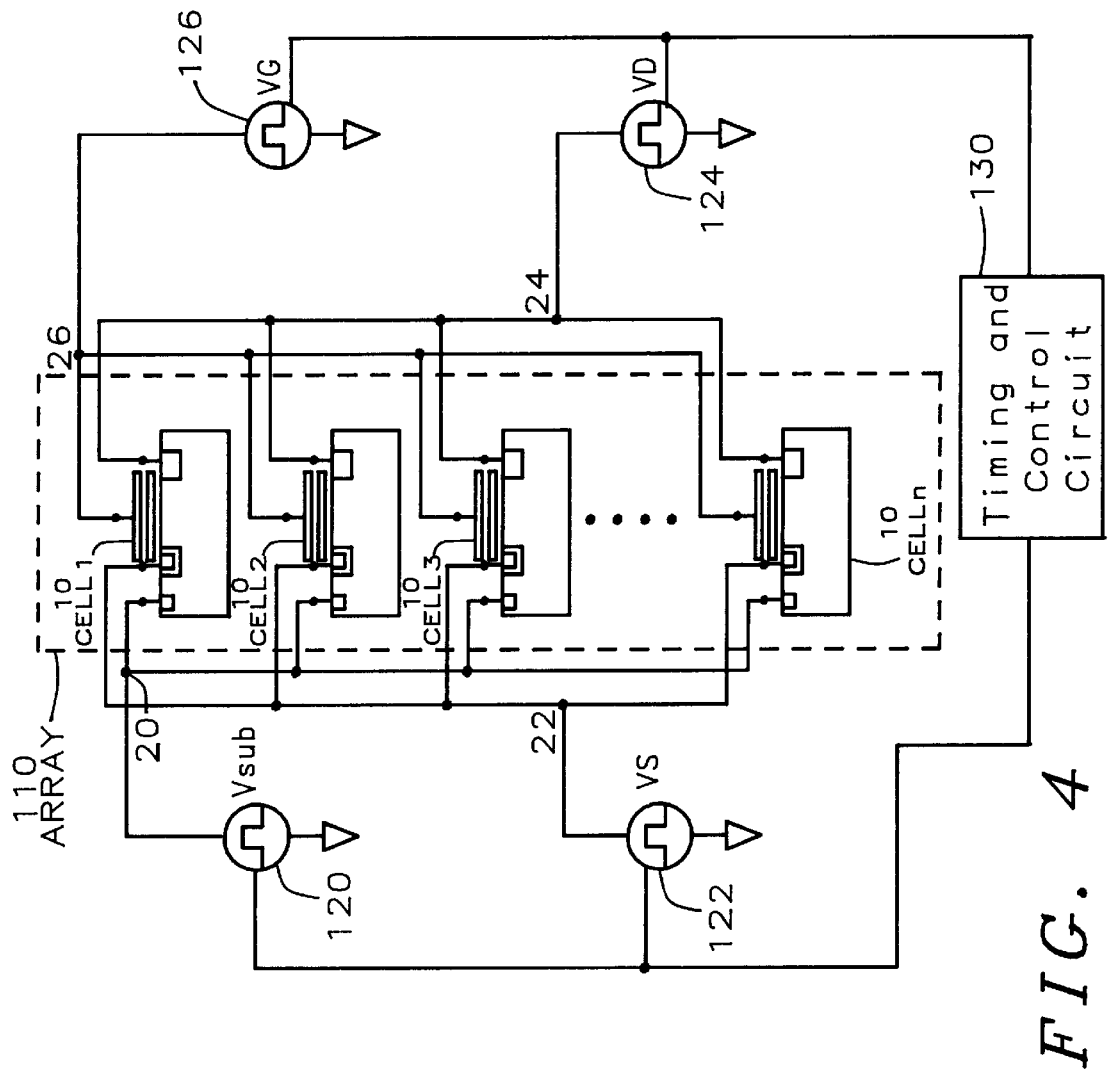
FIG. 4 is an array of flash EEPROM cells showing the connections of the voltage generators of this invention.

Referring now to FIG. 4, an array 110 of flash EEPROM cells 10 are disposed upon a common substrate. For convenience of design, the cells Cell1, Cell2, Cell3, . . . , Celln will be formed into rows and column. The array will have auxiliary circuitry (not shown) that will address either the individual cells Cell1, Cell2, Cell3, . . . , Celln or groups of cells for reading from the cells or for writing or programming the cells. The writing or programming procedures will be as described for the flash EEPROM cell of FIG. 1.

The connection for the substrate voltage generator Vsub 120 will be connected through the terminal 20 to the p-type substrate. The connection of the source voltage generator VS 122 to the source region is through the terminal 22. The connection of the drain voltage generator VD 124 to the drain region is through terminal 24. And the connection of the gate control voltage generator VG 126 to the control gate is through the terminal 26. The timing and control circuitry 130 in conjunction with the auxiliary circuitry (not shown) will determine the voltages and timings for the substrate voltage generator Vsub 120, the source voltage generator VS 122, The drain voltage generator VD 124, and the gate control voltage generator VG 126.

Figure 5:
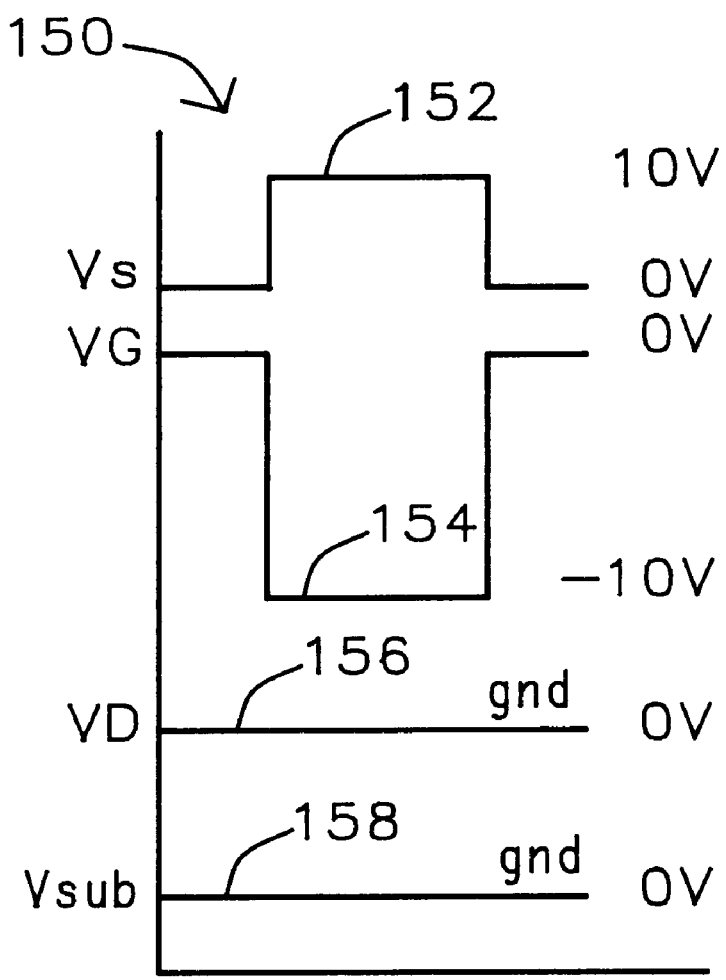
FIG. 5 is timing diagram of an erase cycle of a flash EEPROM of this invention.

Refer now to FIGS. 1, 4, and 5 to understand the erase cycle of this invention. The erase cycle starts by setting the source voltage generator VS 122 and thus the source 16 to a relatively large positive voltage (approximately +10V) 152. The gate control voltage generator VG 126 and consequently the control gate 28 will be set to a relatively large negative voltage (approximately −10V) 154. The substrate voltage generator Vsub 120 and thus the p-type substrate 12 will be set to the ground reference potential (0V) 158. The drain voltage generator VD 124 and thus the drain region 14 will be connected to ground reference potential (0V) 156. The voltages as described will force the trapped charges 33 on the floating gate 32 of the flash EEPROM cell 10 to migrate to the end of the floating gate 32 immediately above the source region 16. The electric field in the tunneling oxide 36 will force these trapped electrons to flow through the tunneling oxide 36 by the Fowler-Nordheim tunneling into the source region 16.

The relative period of time for the erase cycle 150 is from approximately 10 m sec to 2 sec in duration. The voltage of the relatively large positive voltage can range from approximately 5.0V to approximately 15.0 V. The voltage of the relatively large negative voltage source can range from approximately 0V to approximately −15.0V. The range of these voltages is dependent on the thickness of the tunneling oxide.

Figure 6:
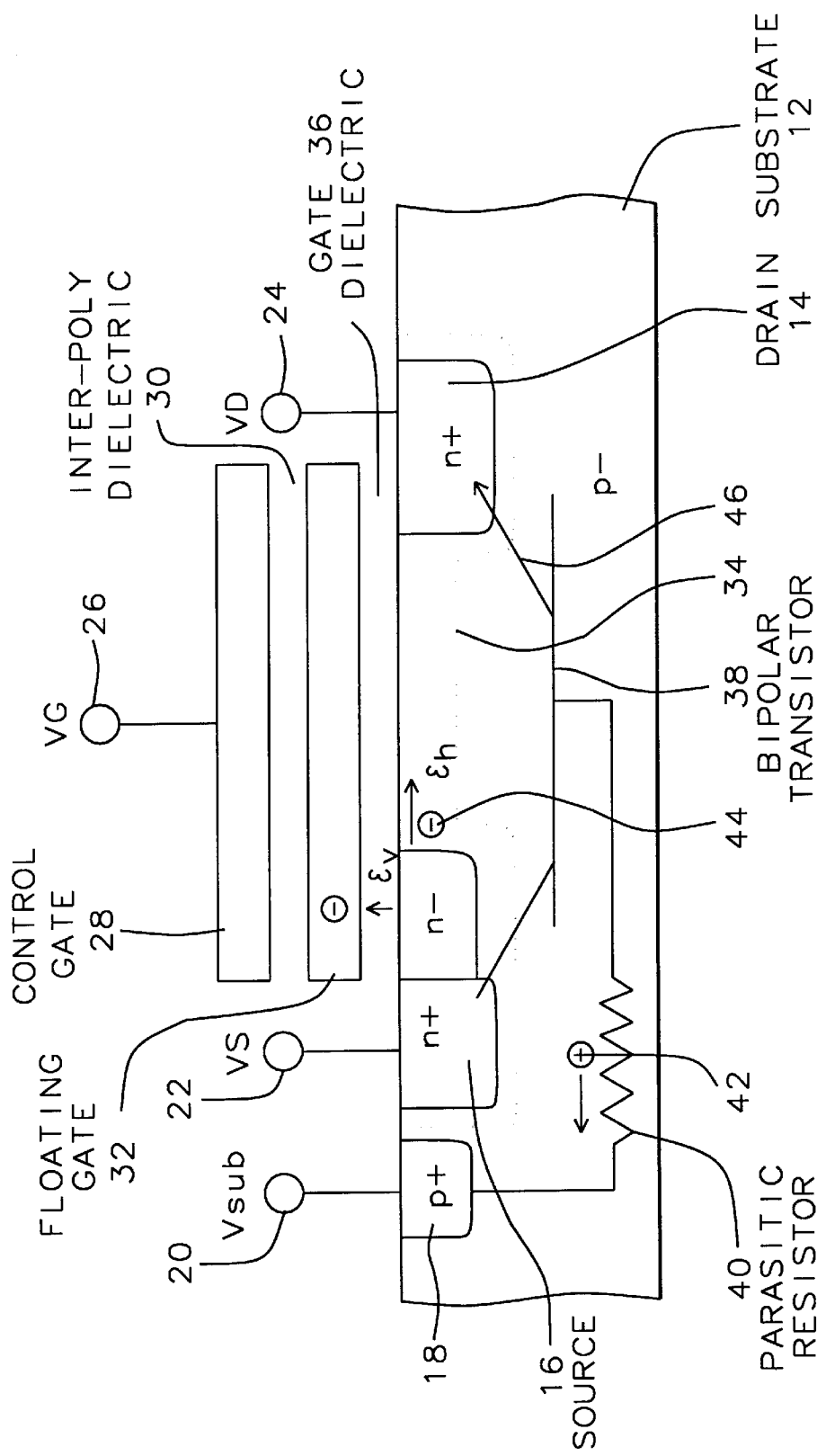
FIG. 6 is a cross-sectional view of a flash EEPROM illustrating the physical basis of the erase cycle of this invention.

Refer now to FIG. 6 for a description of the physical basis for the erase cycle of the flash EEPROM of this invention. As above described, during the erase cycle, the gate control voltage generator VG is set to a relatively large negative voltage (−10V). Since the gate control voltage generator VG is connected through the terminal 26 to the control gate 28, the control gate 28 will be set to the relatively large negative voltage (−10V). The p-type substrate 12 and the drain 14 will be connected through their respective voltage generators to the ground reference potential (0V). The voltage of the source voltage generator VS will be set to the relatively large positive voltage (10V) which will be connected through terminal 22 of FIG. 4 to the source 16.

The voltage as described will set up an electric field $\epsilon_v$ in the gate dielectric or tunneling oxide 36, which will allow the Fowler-Nordheim tunneling to begin. At this same time an electrical field $\epsilon_h$ is developed between the source region 16 to the drain region 14. Electrons 44 begin to flow in the channel region 34 creating electron/hole pairs. The holes 42 flow through the parasitic substrate resistor 40. This current is sufficient to cause the p-n junction 46 at the drain region 14 to begin to conduct. This causes more current to flow between the source region 16 and the drain region 14. This current is accelerated by the field $\epsilon_h$. More electron/hole pairs are generated and the parasitic bipolar transistor 38 will have a snap back condition where the voltage between the drain region 14 and the source region 16 to be brought to a low value. This causes the voltage VS at the source region 16 to be clamped at a fixed voltage.

This decrease in the voltage at the source region 16 causes the electric field $\epsilon_v$ in the tunneling oxide 36 from exceeding a critical value of 10 MeV/cm where the high stress in the tunneling oxide 36 is eliminated and thus the damage to the tunneling oxide 36. The decrease of the electric field $\epsilon_y$ in the tunneling oxide 36 prevents increase in the erased threshold voltage of the flash EEPROM of this invention. The erased threshold voltage of the flash EEPROM of this invention occurs when no charges are trapped on the floating gate 32. Further, the decrease of the electric field $\epsilon_y$ in the tunneling oxide 36 prevents decrease in the programmed threshold voltage of the flash EEPROM of this invention. The programmed threshold voltage of the flash EEPROM of this invention occurs when charges are trapped on the floating gate 32. This difference between the erased threshold voltage and the programmed threshold voltage is identified as the closure or separation factor of the write/erase threshold voltage.

Figure 7:
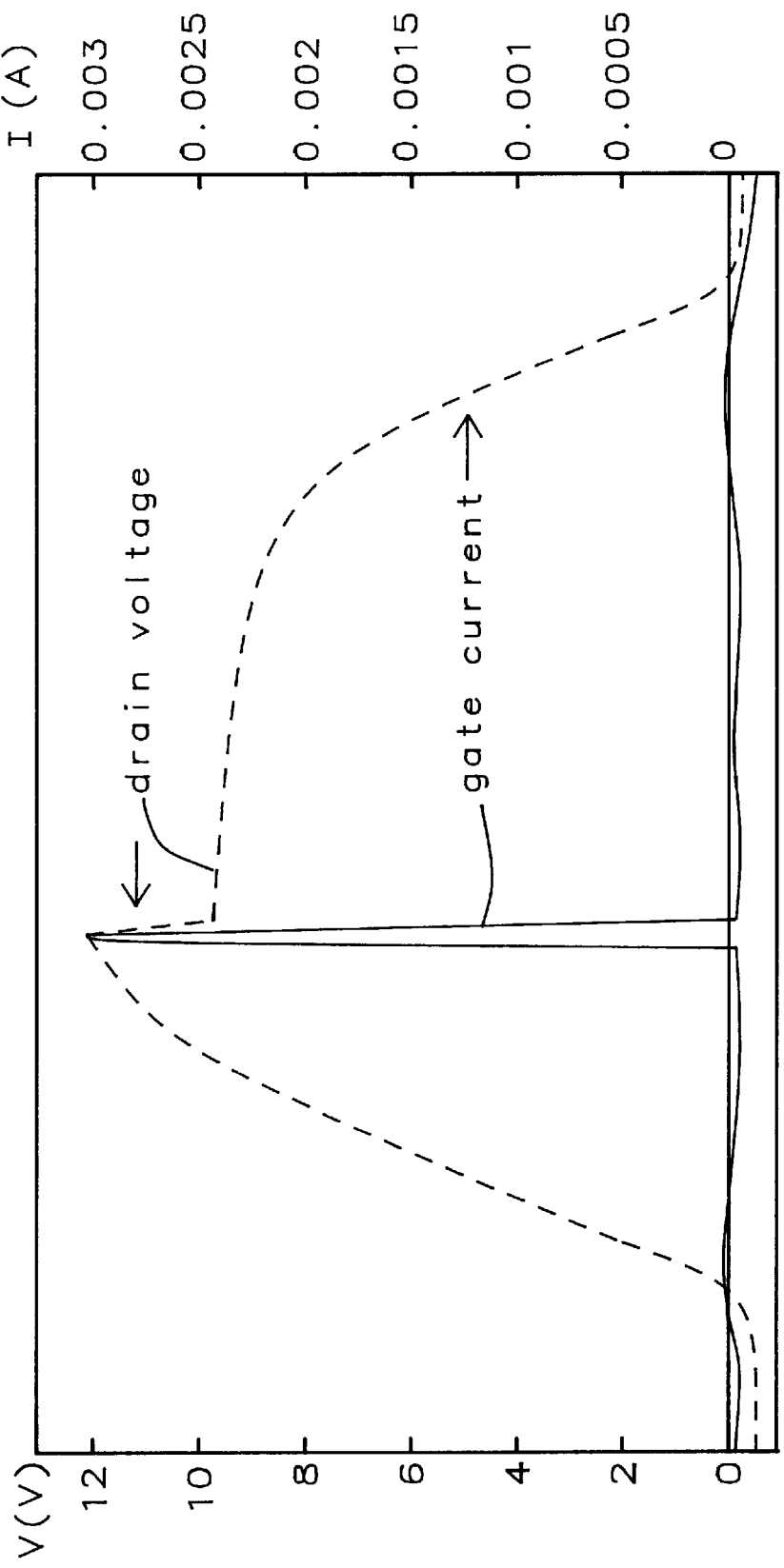
FIG. 7 is a plot of the drain voltage clamped as the flash EEPROM is driven into snapback during the erase cycle of this invention.

FIG. 7 is a illustration of the snapback effect present at the drain of the flash EEPROM. A sine wave is applied by drain voltage generator VD to the terminal 24 to the drain 14 of FIG. 6. The sine wave will have an amplitude that will approach 12V. The gate control voltage generator VG, the source voltage generator VS, and the substrate voltage generator Vsub will be connected to the ground reference potential (0V) to respectively to place the control gate 28, the source 16, and the substrate 12 at the ground reference potential (0V). Once the electric field $\epsilon_y$ within the gate dielectric 36 reaches 10 Mev (12.4V divided by 125 Å), the flash EEPROM is driven into the snapback condition and the voltage from the drain 14 to the source 16 will be clamped to a fixed value of approximately 10V. At the instance of the snapback the current in the drain 14 will spike to an amplitude of greater than 3 ma. This spiking of the current will occur when the parasitic bipolar transistor 38 conducts. The clamping of the voltage from the drain 14 to the source 16 will prevent excess electric field stress within the tunneling oxide 36.

While this invention has been particularly shown and described with reference to the preferred embodiments thereof, it will be understood by those skilled in the art that various changes in form and details may be made without departing from the spirit and scope of the invention.

What is claimed is:

1. A method to erase a flash EEPROM cell, which is comprised of a control gate, a floating gate, a source, a drain, and a tunneling oxide disposed upon a semiconductor substrate, to prevent a write/erase threshold voltage closure and damage from high field stress in said tunneling oxide after repeatedly writing and erasing said flash EEPROM cell, comprising the steps of:

a) applying a relatively high positive voltage pulse to the source of said EEPROM cell;

b) simultaneously applying a ground reference voltage to the drain and to the semiconductor substrate; and c) simultaneously applying a relatively large negative voltage pulse to said control gate;

wherein erasing the flash EEPROM cell causes a parasitic bipolar transistor inherent in said flash EEPROM cell to begin to conduct and go into a snap back condition, thus reducing excess field stress in said tunneling oxide, while removing charges from the floating gate.

2. The method to erase a flash EEPROM cell of claim 1 wherein the relatively high positive voltage pulse has a voltage of from approximately 5V to approximately 15V.

3. The method to erase a flash EEPROM cell of claim 1 wherein the relatively large negative voltage pulse has a voltage of approximately 0V to approximately −15V.

4. The method to erase a flash EEPROM cell of claim 1 wherein the relatively high positive voltage pulse and the relatively large negative voltage pulse each have a duration of from approximately 10 milliseconds to two seconds.

5. A non-volatile semiconductor memory device comprising:

a) a semiconductor substrate of a first conductivity type;

b) a pair of diffusions of a second conductivity type spaced distally from one another to form a source region and a drain region within said semiconductor substrate;

c) a tunneling oxide insulation disposed upon said semiconductor substrate in a region generally between the source region and drain region in correspondence with a channel region and having a thickness which allows tunneling of carriers there through;

d) a floating gate electrode disposed upon said tunneling oxide insulation generally in correspondence with said channel region;

e) an inter-poly dielectric insulation disposed upon said floating gate electrode to insulate said floating gate electrode;

f) a control gate electrode disposed upon said inter-poly dielectric insulation generally aligned with said floating gate electrode; and g) an erasing means for removing electrical charges from said floating gate electrode to improve a separation factor of a programmed threshold voltage and an erased threshold voltage of said non-volatile semiconductor memory device and to reduce high field stress in said tunneling oxide wherein charges are removed from the floating gate by the steps of:

coupling a relatively high positive voltage source to apply a relatively high positive voltage pulse to the source region, simultaneously coupling a ground reference voltage source to the drain region and to the semiconductor substrate, and simultaneously coupling a relatively large negative voltage source to apply a relatively large negative voltage pulse to said control gate electrode;

wherein the erasing means causes a parasitic bipolar transistor inherent in a flash EEPROM cell to begin to conduct and go into a snap back condition, thus reducing excess field stress in said tunneling oxide, while removing charges from the floating gate.

6. The non-volatile semiconductor memory device of claim 5 wherein the relatively high positive voltage pulse has a voltage of from approximately 5V to approximately 15V.

7. The non-volatile semiconductor memory device of claim 5 wherein the relatively large negative voltage pulse has a voltage of from approximately 0V to approximately −15V.

8. The non-volatile semiconductor memory device of claim 5 wherein the relatively high positive voltage pulse and the relatively large negative voltage pulse each have a duration of from approximately 10 milliseconds to approximately two seconds.

9. A non-volatile semiconductor memory device comprising:

a) a semiconductor substrate of a first conductivity type;

b) a plurality of memory cells arranged in an array wherein each cell comprises:

a pair of diffusions of a second conductivity type spaced distally from one another to form a source region and a drain region within said semiconductor substrate, a tunneling oxide insulation disposed upon said semiconductor substrate in a region generally between the source region and drain region in correspondence with a channel region and having a thickness which allows tunneling of carriers there through, a floating gate electrode disposed upon said tunneling oxide insulation generally in correspondence with said channel region, an inter-poly dielectric insulation disposed upon said floating gate electrode to insulate said floating gate electrode and a control gate electrode disposed upon said inter-poly dielectric insulation generally aligned with said floating gate electrode; and c) an erasing means for removing electrical charges from said floating gate electrode to improve a separation factor of a programmed threshold voltage and an erased threshold voltage and to prevent damage due to high field stress in said tunneling oxide of said non-volatile semiconductor memory device, whereby charges are removed from the floating gate by the steps of:

coupling a relatively high positive voltage source to apply a relatively high positive voltage pulse to the source region, simultaneously coupling a ground reference voltage source to the drain region and to the semiconductor substrate, and simultaneously coupling a relatively large negative voltage source to apply a relatively large negative voltage pulse to said control gate electrode;

wherein the erasing means causes a parasitic bipolar transistor inherent in said memory cell to begin to conduct and go into a snap back condition, thus reducing excess field stress in said tunneling oxide, while removing charges from the floating date.

10. The non-volatile semiconductor memory device of claim 9 wherein the relatively high positive voltage pulse has a voltage of from approximately 5V to approximately 15v.

11. The non-volatile semiconductor memory device of claim 9 wherein the relatively large negative voltage pulse has a voltage of from approximately 0V to approximately −15V.

12. The non-volatile semiconductor memory device of claim 9 wherein the relatively high positive voltage pulse and the relatively large negative voltage pulse each have a duration of from approximately 10 milliseconds to approximately 2 seconds.

13. An erasing circuit for removing charges from flash EEPROM cells, wherein a flash EEPROM cell comprises a drain region, a source region, a floating gate, a control gate, a tunneling oxide, and an inter-poly dielectric disposed upon a semiconductor substrate, comprising:

a) a first voltage source coupled to the control gate;

b) a second voltage source coupled to the source region;

c) a third voltage source coupled to the drain region;

d) a fourth voltage source coupled to the semiconductor substrate; and e) an erasing control means coupled to the first, second, third, and fourth voltage sources to control said first, second, third, and fourth voltage sources wherein said removing of charges is accomplished by:

forcing said second voltage source to apply a relatively high positive voltage pulse to the source of said EEPROM cell, simultaneously forcing the third and fourth voltage sources to a ground reference voltage, and simultaneously forcing said first voltage source to apply a relatively large negative voltage pulse to said control gate;

wherein said erasing control means causes a parasitic bipolar transistor inherent in said flash EEPROM cell to begin to conduct and go into a snap back condition, thus reducing excess field stress in said tunneling oxide, while removing charges from the floating gate thus allowing a separation of a programmed threshold voltage from an erased threshold voltage to be maintained over the repeated writing and erasing of said flash EEPROM, thus improving a write/erase threshold voltage closure.

14. The erasing circuit of claim 13 wherein the relatively high positive voltage pulse has a voltage of from approximately 5V to approximately 15v.

15. The erasing circuit of claim 13 wherein the relatively large negative voltage pulse has a voltage of from approximately 0V to approximately −15V.

16. The erasing circuit of claim 15 wherein the relatively high positive voltage pulse and the relatively large negative voltage pulse each have a duration of from approximately 10 milliseconds to approximately two seconds.

* * * * *